United States Patent
Liu et al.

(10) Patent No.: US 9,130,590 B2
(45) Date of Patent: Sep. 8, 2015

(54) NON-BINARY LAYERED LOW DENSITY PARITY CHECK DECODER

(71) Applicant: LSI Corporation, San Jose, CA (US)

(72) Inventors: Dan Liu, Shanghai (CN); Qi Zuo, Shanghai (CN); Chung-Li Wang, San Jose, CA (US); Zongwang Li, San Jose, CA (US); Lei Wang, Shanghai (CN)

(73) Assignee: LSI CORPORATION, San Jose, CA (US)

( * ) Notice: Subject to any disclaimer, the term of this patent is extended or adjusted under 35 U.S.C. 154(b) by 0 days.

(21) Appl. No.: 14/070,541

(22) Filed: Nov. 3, 2013

(65) Prior Publication Data
US 2015/0092290 A1    Apr. 2, 2015

(51) Int. Cl.
*G11B 5/09*   (2006.01)
*G11B 5/027*  (2006.01)
*H03M 13/00*  (2006.01)
*H03M 13/11*  (2006.01)
*G11B 20/18*  (2006.01)

(52) U.S. Cl.
CPC ....... *H03M 13/1125* (2013.01); *G11B 20/1833* (2013.01); *H03M 13/114* (2013.01); *H03M 13/1117* (2013.01); *H03M 13/1171* (2013.01); *H03M 13/658* (2013.01); *G11B 2020/185* (2013.01); *H03M 13/6331* (2013.01); *H03M 13/6343* (2013.01)

(58) Field of Classification Search
CPC .... G11B 27/36; G11B 5/012; G11B 2220/20; G11B 20/10009; G11B 5/09; H03M 13/09; H03M 1/0061; H03M 13/1515; H03M 13/2957; H03M 13/45; H03M 1/0097
USPC ........ 714/752, 746, 758, 784; 360/40, 41, 25, 360/29, 39
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |

(Continued)

OTHER PUBLICATIONS

Casado et al., Multiple-rate low- density parity-check codes with constant blocklength, IEEE Transations on communications, Jan. 2009, vol. 57, pp. 75-83.

(Continued)

*Primary Examiner* — Nabil Hindi
(74) *Attorney, Agent, or Firm* — Hamilton DeSanctis & Cha

(57) ABSTRACT

A non-binary layered low density parity check decoder includes a variable node processor operable to generate variable node to check node messages and to calculate perceived values based on normalized check node to variable node messages and on normalized decoder inputs, and to output normalized decoded values, and a check node processor operable to generate the check node to variable node messages based on normalized variable node to check node messages.

20 Claims, 5 Drawing Sheets

(56) References Cited

U.S. PATENT DOCUMENTS

| | | |
|---|---|---|
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,473,878 B1 | 10/2002 | Wei |
| 6,535,553 B1 | 3/2003 | Limberg et al. |
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,802,172 B2 | 9/2010 | Casado |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,201,051 B2 | 6/2012 | Tan |
| 8,237,597 B2 | 8/2012 | Liu |
| 8,261,171 B2 | 9/2012 | Annampedu |
| 8,291,284 B2 | 10/2012 | Savin |
| 8,295,001 B2 | 10/2012 | Liu |
| 8,566,666 B2 * | 10/2013 | Wang et al. .................. 714/758 |
| 9,015,550 B2 | 4/2015 | Wang et al. |
| 2003/0093741 A1 | 5/2003 | Argon et al. |
| 2006/0123318 A1 | 6/2006 | Kim et al. |
| 2007/0067694 A1 | 3/2007 | Spencer |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2009/0304111 A1 | 12/2009 | Shinya et al. |
| 2011/0167227 A1 | 7/2011 | Yang |
| 2011/0179333 A1 | 7/2011 | Wesel et al. |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Spagnol et al, "Hardware Implementation of GF($2^m$) LDPC Decoders", IEEE Transactions on Circuits and Systemssi: Regular Papers, vol. 56, No. 12 (Dec. 2009).

Yeo et al., "VLSI Architecture for Iterative Decoders in Magnetic Storage Channels", Mar. 2001, pp. 748-755, IEEE trans. Magnetics, vol. 37, No. 2.

Zhong et al., "Quasi Cyclic LDPC Codes for the Magnetic Recording Channel: Code Design and VSLI Implementation", IEEE Transactions on Magnetics, v. 43, pp. 1118-1123, Mar. 7.

Axvig et al., "Average Min-Sum Decoding of LDPC Codes", 5th International Symposium on Turbo Codes and Related Topics (2008).

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fair et al., "Guided scrambling: a new line coding technique for high bit rate fiber optic transmission systems", IEEE Trans. Commun., vol. 39, pp. 289-297 (Feb. 1991).

Fan et al.,"Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al 'A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes & Related Topics, 2008.

Jin et al., "Design Techniques for Weakly Constrained Codes", IEEE Trans Commun. vol. 51, No. 5, pp. 709-714 (May 2003).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

(56) References Cited

OTHER PUBLICATIONS

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsši: Regular Papers, Vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/283,549, Unpublished (filed Oct. 27, 2011) (Wu Chang).

U.S. Appl. No. 13/302,119, Unpublished (filed Nov. 22, 2011) (Lei Chen).

U.S. Appl. No. 14/048,897, Unpublished (filed Oct. 8, 2013) (George Mathew).

U.S. Appl. No. 13/269,852, Unpublished (filed Oct. 10, 2011) (Haitao Xia).

U.S. Appl. No. 13/284,767, Unpublished (filed Oct. 28, 2011) (Fan Zhang).

U.S. Appl. No. 13/269,832, Unpublished (filed Oct. 10, 2011) (Haitao Xia).

U.S. Appl. No. 13/227,544, Unpublished (filed Sep. 8, 2011) (Shaohua Yang).

U.S. Appl. No. 13/239,683, Unpublished (filed Sep. 22, 2011) (Changyou Xu).

U.S. Appl. No. 13/213,751, Unpublished (filed Aug. 19, 2011) (Fan Zhang).

U.S. Appl. No. 13/305,551, Unpublished (filed Nov. 28, 2011) (Yang Han).

U.S. Appl. No. 13/227,416, Unpublished (filed Sep. 7, 2011) (Lei Chen).

U.S. Appl. No. 13/296,022, Unpublished (filed Nov. 14, 2011) (Victor Krachkovsky).

U.S. Appl. No. 13/174,537, Unpublished (filed Jun. 30, 2011) (Anantha Raman Krishnan).

U.S. Appl. No. 13/174,453, Unpublished (filed Jun. 30, 2011) (Johnson Yen).

U.S. Appl. No. 13/171,615, Unpublished (filed Jun. 29, 2011) (Bradley D. Seago).

U.S. Appl. No. 13/113,219, Unpublished (filed May 23, 2011) (Yang Han).

U.S. Appl. No. 13/300,078, Unpublished (filed Nov. 18, 2011) (Chung-Li Wang).

U.S. Appl. No. 13/186,234, Unpublished (filed Jul. 19, 2011) (Haitao Xia).

U.S. Appl. No. 13/741,003, Unpublished (filed Jan. 14, 2013) (Lu Lu).

U.S. Appl. No. 13/597,001, Unpublished (filed Aug. 28, 2012) (Fan Zhang).

U.S. Appl. No. 13/295,150, Unpublished (filed Nov. 14, 2011) (Zongwang Li).

U.S. Appl. No. 13/621,341, Unpublished (filed Sep. 17, 2012) (Shaohua Yang).

U.S. Appl. No. 13/284,730, Unpublished (filed Oct. 28, 2011) (Fan Zhang).

U.S. Appl. No. 13/989,583, Unpublished (filed Oct. 15, 2012) (Shaohua Yang).

U.S. Appl. No. 13/622,294, Unpublished (filed Sep. 18, 2012) (Fan Zhang).

U.S. Appl. No. 13/670,393, Unpublished (filed Nov. 6, 2012) (Lei Chen).

U.S. Appl. No. 13/777,841, Unpublished (filed Feb. 26, 2013) (Shu Li).

U.S. Appl. No. 13/596,978, Unpublished (filed Aug. 28, 2012) (Fan Zhang).

U.S. Appl. No. 13/777,381, Unpublished (filed Feb. 26, 2013) (Shaohua Yang).

U.S. Appl. No. 13/619,907, Unpublished (filed Sep. 14, 2012) (Fan Zhang).

U.S. Appl. No. 13/873,224, Unpublished (filed Apr. 30, 2013) (Razmik Karabed).

U.S. Appl. No. 13/875,951, Unpublished (filed May 2, 2013) (Mikhail I Grinchuk).

U.S. Appl. No. 13/742,340, Unpublished (filed Jan. 15, 2013) (Razmik Karabed).

U.S. Appl. No. 13/886,103, Unpublished (filed May 2, 2013) (Chung-Li Wang).

U.S. Appl. No. 13/898,685, Unpublished (filed May 21, 2013) (Dan Liu).

U.S. Appl. No. 13/912,079, Unpublished (filed Jun. 6, 2013) (Zongwang Li).

U.S. Appl. No. 13/947,768, Unpublished (filed Jul. 22, 2013) (Johnson Yen).

U.S. Appl. No. 14/015,126, Unpublished (filed Aug. 30, 2013) (Lu Pan).

U.S. Appl. No. 13/777,976, Unpublished (filed Feb. 26, 2013) (Shu Li).

U.S. Appl. No. 13/340,974, Unpublished (filed Dec. 30, 2011) (Dan Liu).

U.S. Appl. No. 13/426,714, Unpublished (filed Mar. 22, 2012) (Shaohua Yang).

U.S. Appl. No. 13/372,580, Unpublished (filed Feb. 14, 2012) (Fan Zhang).

U.S. Appl. No. 13/422,986, Unpublished (filed Mar. 16, 2012) (Fan Zhang).

U.S. Appl. No. 13/597,026, Unpublished (filed Aug. 28, 2012) (Fan Zhang).

U.S. Appl. No. 13/445,848, Unpublished (filed Apr. 12, 2012) (Bruce A. Wilson).

U.S. Appl. No. 13/596,947, Unpublished (filed Aug. 28, 2012) (Fan Zhang).

U.S. Appl. No. 13/362,409, Unpublished (filed Jan. 31, 2012) (Fan Zhang).

U.S. Appl. No. 13/316,858, Unpublished (filed Dec. 12, 2011) (Zongwang Li).

U.S. Appl. No. 13/412,520, Unpublished (filed Mar. 5, 2012) (Fan Zhang).

U.S. Appl. No. 13/327,279, Unpublished (filed Dec. 15, 2011) (Wei Feng).

U.S. Appl. No. 13/433,693, Unpublished (filed Mar. 29, 2012) (Fan Zhang).

U.S. Appl. No. 13/340,951, Unpublished (filed Dec. 30, 2011) (Lei Chen).

U.S. Appl. No. 13/369,468, Unpublished (filed Feb. 9, 2012) (Zongwang Li).

U.S. Appl. No. 13/445,878, Unpublished (filed Apr. 12, 2012) (Yu Liao).

U.S. Appl. No. 13/474,660, Unpublished (filed May 17, 2012) (Zongwang Li).

U.S. Appl. No. 13/363,751, Unpublished (filed Feb. 1, 2012) (Lei Chen).

U.S. Appl. No. 13/445,834, Unpublished (filed Apr. 12, 2012) (Chung-Li Wang).

U.S. Appl. No. 13/545,833, Unpublished (filed Jul. 10, 2012) (Zhi Bin Li).

U.S. Appl. No. 13/305,510, Unpublished (filed Nov. 28, 2011) (Lei Chen).

U.S. Appl. No. 13/596,819, Unpublished (filed Aug. 28, 2012) (Shaohua Yang).

U.S. Appl. No. 13/316,741, Unpublished (filed Dec. 12, 2011) (Yang Han).

Vasic, B., "High-Rate Girth-Eight Codes on Rectangular Integer Lattices", IEEE Trans. Communications, vol. 52, Aug. 2004, pp. 1248-1252.

(56) References Cited

OTHER PUBLICATIONS

Vasic, B., "High-Rate Low-Density Parity-Check Codes Based on Anti-Pasch Affine Geometries," Proc ICC 2002, pp. 1332-1336.

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Yeo et al., "VLSI Architecture for Iterative Decoders in Magnetic Storage Channels", Mar. 2001, pp. 748-55, IEEE trans. Magnetics, vol. 37, No. 2.

Zhang et al., "Analysis of Verification-Based Decoding on the q-ary Symmetric Channel for Large q", IEEE Trans. On Information Theory, vol. 57, No. 10 (Oct. 2011).

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

US 9,130,590 B2

NON-BINARY LAYERED LOW DENSITY PARITY CHECK DECODER

FIELD OF THE INVENTION

Various embodiments of the present invention provide systems and methods for low density parity check decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, parity bits can be added to groups of data bits, ensuring that the groups of data bits (including the parity bits) have either even or odd numbers of ones, and used in error correction systems such as Low Density Parity Check (LDPC) decoders.

BRIEF SUMMARY

Some embodiments of the present invention provide a non-binary layered low density parity check decoder includes a variable node processor operable to generate variable node to check node messages and to calculate perceived values based on normalized check node to variable node messages and on normalized decoder inputs, and to output normalized decoded values, and a check node processor operable to generate the check node to variable node messages based on normalized variable node to check node messages.

This summary provides only a general outline of some embodiments according to the present invention. Many other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Embodiments of the present invention are related to a non-binary layered low density parity check decoder with normalized input and output. Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

A low density parity check code is defined by a sparse parity check matrix H of size m×n, where m<n. A codeword c of length n satisfies all the m parity check equations defined by H, i.e., $cH^T=0$, where 0 is a zero vector. Decoder convergence is checked by determining whether the syndrome $s=cH^T$ is all zero. The syndrome is a vector of length m, with each bit corresponding to a parity check. A zero bit in a syndrome means the check is satisfied, while a non-zero bit in the syndrome is an unsatisfied check (USC). By definition, a codeword has syndrome s=0. A non-codeword has a non-zero syndrome.

Figure 1:
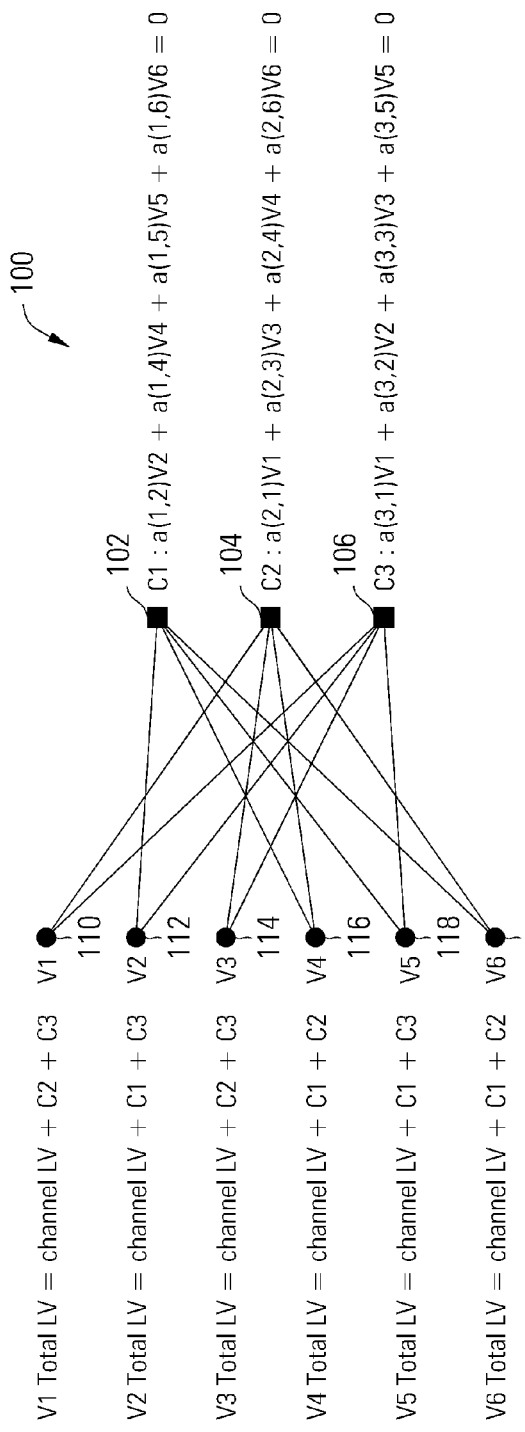
FIG. 1 depicts a Tanner graph of a low density parity check code that can be decoded in a non-binary layered low density parity check decoder with normalized input and output in accordance with one or more embodiments of the present invention.

Low density parity check codes are also known as graph-based codes with iterative decoding algorithms, which can be visually represented in a Tanner graph 100 as illustrated in FIG. 1. In a low density parity check decoder, multiple parity checks are performed in a number of check nodes 102, 104 and 106 for a group of variable nodes 110, 112, 114, 116, 118, and 120. The connections (or edges) between variable nodes 110-120 and check nodes 102-106 are selected as the low density parity check code is designed, balancing the strength of the code against the complexity of the decoder required to execute the low density parity check code as data is obtained. The number and placement of parity bits in the group are selected as the low density parity check code is designed. Messages are passed between connected variable nodes 110-120 and check nodes 102-106 in an iterative process, passing beliefs about the values that should appear in variable nodes 110-120 to connected check nodes 102-106. Parity checks are performed in the check nodes 102-106 based on the messages and the results are returned to connected variable nodes 110-120 to update the beliefs if necessary.

In a non-binary low density parity check decoder, variable nodes 110-120 contain symbols from a Galois Field, a finite field $GF(p^k)$ that contains a finite number of elements, characterized by size $p^k$ where p is a prime number and k is a positive integer. Messages representing variable node values in the non-binary low density parity check decoders are multi-dimensional vectors, containing likelihood values representing the probability that the sending variable node contains a particular value. The term "likelihood value" is used herein to refer to a likelihood or probability that a symbol has a particular value, whether it is represented as a plain-likelihood probability value, a log likelihood ratio (LLR) value, or any other representation of a likelihood.

The connections between variable nodes 110-120 and check nodes 102-106 can be presented in matrix form, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} 0 & a(1,2) & 0 & a(1,4) & a(1,5) & a(1,6) \\ a(2,1) & 0 & a(2,3) & a(2,4) & 0 & a(2,6) \\ a(3,1) & a(3,2) & a(3,3) & 0 & a(3,5) & 0 \end{bmatrix}$$

For example, in some embodiments of a GF(4) decoder, each Galois field element a(i,j) specifies a shift for the corresponding circulant matrix of 0, 1, 2 or 3.

The non-binary layered low density parity check decoder uses quasi-cyclic codes in which the parity check H matrix is a matrix of circulant sub-matrices, cyclically shifted versions of identity matrices and null matrices with different cyclical shifts specified by the H matrix non-zero entry values a(i,j). Each circulant $P_{i,j}$ is a p×p sub-matrix with the form:

$$P_{i,j} = \begin{bmatrix} 0 & \alpha & 0 & \cdots & 0 \\ 0 & 0 & \alpha & \cdots & 0 \\ \vdots & \vdots & \vdots & \ddots & \vdots \\ 0 & 0 & 0 & \cdots & \alpha \\ \alpha & 0 & 0 & \cdots & 0 \end{bmatrix}$$

where entry value $\alpha$ is an element over the Galois Field $GF(2^m)$, which has $2^{m-1}$ possible values.

In some embodiments, the entry value $\alpha$ is randomly selected from the Galois Field. The entry value $\alpha$ provides a permutation for messages between the variable node and check node connected by the entry, where a multiplication in the Galois Field of the message by the current layer entry value is performed. This permutation, performed by the variable node unit or variable node processor in the non-binary layered low density parity check decoder with normalized input and output, is also referred to herein as rearranging. Similarly, when messages are passed back from a check node to a variable node, the messages are inverse-rearranged by the previous layer entry value, where a division in the Galois Field of the message by the current layer entry value is performed.

By providing multiple check nodes 102-106 for the group of variable nodes 110-120, redundancy in error checking is provided, enabling errors to be corrected as well as detected. Each check node 102-106 performs a parity check on bits or symbols passed as messages from its neighboring (or connected) variable nodes. In the example low density parity check code corresponding to the Tanner graph 100 of FIG. 1, check node 102 checks the parity of variable nodes 112, 116, 118 and 120. Perceived values of a variable node are updated based on the parity check results from connected check nodes. For example, the perceived value or likelihood value (LV) of variable node 110 is updated based on the channel likelihood value or previous likelihood value, along with the check node messages (C2, C3) from connected check nodes 104, 106. Values are passed back and forth between connected variable nodes 110-120 and check nodes 102-106 in an iterative process until the low density parity check code converges on a value for the group of data and parity bits in the variable nodes 110-120, or until a maximum number of iterations is reached. For example, variable node 110 passes messages to check nodes 104 and 106, referred to herein as variable node to check node messages or V2C messages. Check node 102 passes messages back to variable nodes 112, 116, 118 and 120, referred to herein as check node to variable node messages or C2V messages. The messages between variable nodes 110-120 and check nodes 102-106 are probabilities or beliefs, thus the low density parity check decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-120 and check nodes 102-106, with the values in the nodes 102-120 being adjusted based on the messages that are passed, until the values converge and stop changing or until a maximum number of iterations is reached.

In non-binary layered low density parity check decoder with normalized input and output, the parity check H matrix is partitioned into L layers, with the H matrix being processed row by row and the circulants being processed layer by layer. As the rows are processed, the column results are updated based on each row result. Layered decoding can reduce the time to converge on a result in the decoder in some cases.

Likelihood values can be represented either in normalized format or absolute format in the non-binary layered low density parity check decoder with normalized input and output. In the absolute or non-normalized format, a likelihood value for a symbol or variable node contains the probability for each element of the Galois Field that the symbol or variable node has the value of that element. Thus, for a GF(q) decoder, a likelihood value for a symbol will contain q probabilities, giving the likelihoods that the symbol has the value of each of the q Galois Field elements. In the normalized format, the likelihood value contains a hard decision identifying the Galois Field element with the most likely value of the symbol, and probabilities for the values of the remaining Galois Field elements, each normalized to the likelihood of the most likely Galois Field element. Thus, for a GF(q) decoder, a normalized likelihood value for a symbol will contain a hard decision and q−1 probabilities, giving the most likely symbol value and the likelihoods that the symbol has the value of each of the remaining q Galois Field elements, normalized to the likelihood of the most likely element. In a decoder employing a min-sum decoding algorithm or a variation thereof, the q likelihoods in a likelihood value sum to 1, with the lowest being the most probable. In these embodiments, a normalized likelihood value can be represented as $Q_{i,j}=[Q^*_{i,j}(0), Q_{i,j}(1) \ldots Q_{i,j}(q-1)]$, where $Q^*_{i,j}(0)$ is the hard decision identifying the most likely Galois Field element, and $Q_{i,j}(1) \ldots Q_{i,j}(q-1)$ are the probabilities for the values of the remaining Galois Field elements, each normalized to the likelihood of the most likely Galois Field element, calculated by subtracting from each the likelihood of the most likely Galois Field element. In some embodiments, absolute likelihood values are ordered in vectors according to the element order in the Galois Field, while normalized likelihood values are ordered in vectors according to likelihood, with most likely Galois Field element value placed first in the vector and the least likely placed last.

For some embodiments of a GF(4) non-binary layered low density parity check decoder using log-likelihood ratios, the following table sets forth the hard decisions and normalized log likelihood ratios for the four possible symbol values from the Galois Field:

TABLE 1

Figure 2:
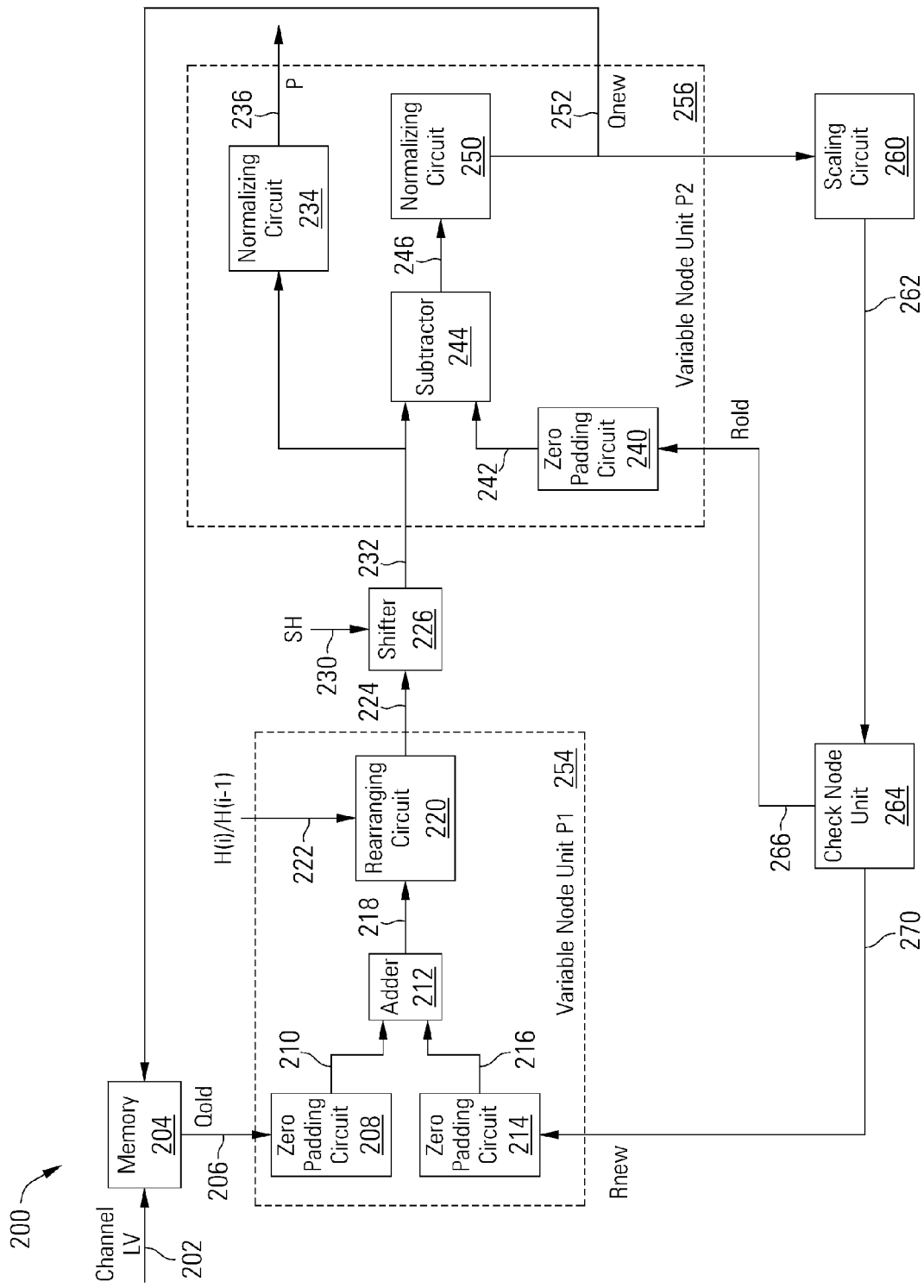
FIG. 2 depicts a non-binary layered low density parity check decoder with normalized input and output in accordance with one or more embodiments of the present invention.

|  | HD | LLR0 | LLR1 | LLR2 |
|---|---|---|---|---|
| LLR related | 00 | 01 | 10 | 11 |
| to symbols | 01 | 00 | 11 | 10 |
|  | 10 | 11 | 00 | 01 |
|  | 11 | 10 | 01 | 00 | where the three log likelihood ratio values LLR0, LLR1, LLR2 are calculated as follows:

if hd=00, LLR0=log(Probability(hd=01))−log(Probability(hd=00));
if hd=00, LLR1=log(Probability(hd=10))−log(Probability(hd=00));
if hd=00, LLR2=log(Probability(hd=11))−log(Probability(hd=00));
if hd=01, LLR0=log(Probability(hd=00))−log(Probability(hd=01));
if hd=01, LLR1=log(Probability(hd=11))−log(Probability(hd=01));
if hd=01, LLR2=log(Probability(hd=10))−log(Probability(hd=01));
if hd=10, LLR0=log(Probability(hd=11))−log(Probability(hd=10));
if hd=10, LLR1=log(Probability(hd=00))−log(Probability(hd=10));
if hd=10, LLR2=log(Probability(hd=01))−log(Probability(hd=10));
if hd=11, LLR0=log(Probability(hd=10))−log(Probability(hd=11));
if hd=11, LLR1=log(Probability(hd=01))−log(Probability(hd=11));
if hd=11, LLR2=log(Probability(hd=00))−log(Probability(hd=11));

Turning to FIG. 2, a non-binary layered low density parity check decoder with normalized input and output 200 is illustrated in block-diagram form in accordance with one or more embodiments of the present invention. Incoming likelihood values for data to be decoded are received at input 202 and stored in a decoder input buffer or memory 204 as initial Q messages, or variable node to check node messages. In some embodiments, the likelihood values include a hard decision and soft data. As used herein, the phrase "soft data" is used in its broadest sense to mean reliability data with each instance of the reliability data indicating a likelihood that a symbol has been correctly detected. In some embodiments of the present invention, the soft data or reliability data is log likelihood ratio data as is known in the art. In some embodiments, the likelihood values are log likelihood ratios. In the non-binary layered low density parity check decoder with normalized input and output 200, the input 202 receives normalized likelihood values, and a decoder output 236 yields normalized likelihood values.

The memory 204 yields stored Q messages 206 for the layer previous to the layer currently being processed, also referred to herein as the previous layer and the connected layer, respectively. The stored Q messages 206 are therefore either initialized by channel likelihood values or calculated in a previous or earlier decoding iteration, and are therefore old Q messages. The stored Q messages 206 are in normalized format, and have been rearranged by the previous layer H matrix entry value $H_{(i-1)}$ and shifted by the previous layer shift value $SH_{(i-1)}$. In some embodiments of the non-binary layered low density parity check decoder with normalized input and output 200, the normalized likelihood values are transformed to absolute likelihood values before doing addition or subtraction because the addition or subtraction operates on a specific solution's likelihood value. The conversion from normalized to absolute likelihood values is referred to herein as zero-padding. The input to the zero-padding circuit is {hd, llr0, llr1, llr2} if q=4, and the output is {llr'0, llr'1, llr'2, llr'3}, where llr'(i) (i=0, 1, 2, 3) is the probability that the symbol is "i" in the log domain. A format conversion circuit or zero padding circuit 208 receives the stored Q messages 206, converts them from normalized to absolute likelihood values, and outputs Q messages 210 in absolute format. The zero padding circuit 208 can comprise any suitable circuitry for converting from normalized to absolute likelihood values. Based upon the disclosure provided herein, one of ordinary skill in the art will recognize a variety of circuits that may be included in zero padding circuit 208.

An adder 212 adds the Q messages 210 to previous layer check node to variable node messages or new R messages 216, yielding a sum or S messages 218 containing total likelihood values for the previous layer. The new R messages 216 are in absolute format, being converted from normalized format new R messages 270 by zero padding circuit 214. The new R messages 216 are referred to as "new" because they are calculated in a current decoding iteration, in contrast with old R messages 266 calculated at least in part in a previous or earlier decoding iteration. Again, columns in the H matrix represent variable nodes, and by adding all the non-zero entries in a column, the connected variable nodes are added to yield the input to a check node. The adder 212 can comprise any suitable circuitry for adding likelihood values, operating in array fashion in some embodiments. Based upon the disclosure provided herein, one of ordinary skill in the art will recognize a variety of circuits that may be included in adder 212.

The S messages 218 are provided to a rearranging circuit 220 which applies a permutation to rearrange the S messages 218 to prepare for the check node update and to apply the permutations specified by the non-zero H matrix entry values.

The symbol order of the S messages 218 is the same as in stored Q messages 206, which is rearranged by the previous layer H matrix entry value $H_{(i-1)}$ and shifted by the previous layer shift value $SH_{(i-1)}$. In order to pass this message to the check node processor or check node unit 264 for the current layer decoding process, the S messages 218 are divided by the previous layer H matrix entry value $H_{(i-1)}$ and then multiplied by the current layer H matrix entry value $H_{(i)}$. The parameter 222 to the rearranging circuit 220 is the delta entry value $(H_{(i)}/H_{(i-1)})$, where the operator "/" represents a division operation in GF(q). In some embodiments, the delta entry value $(H_{(i)}/H_{(i-1)})$ for parameter 222 is pre-computed and stored in any suitable memory. The rearranging circuit 220 can comprise any suitable circuitry for performing division in a Galois Field. Based upon the disclosure provided herein, one of ordinary skill in the art will recognize a variety of circuits that may be included in rearranging circuit 220, such as lookup circuits. For example, in a GF(4) embodiment in which the four elements 0-3 of the Galois Field are 0, 1, $\alpha$, $\alpha^2$, the multiplication in the Galois Field can be performed by rearranging circuit 220 as follows. Element 2 ($\alpha$) multiplied by element 1 (1) equals $\alpha \times 1$ or $\alpha$, which is element 2. Similarly, element $2 \times 2 = \alpha \times \alpha = \alpha^2$, which is element 3. Element $2 \times 3 = \alpha \times \alpha^2 = 1$, which is element 1. Thus, element 2 multiplied by 1, 2 and 3 results in elements 2, 3, and 1, respectively, which are permutations of elements 1, 2 and 3. The rearranging circuit 220 yields P messages 224 for the previous layer at the output of the first part of the variable node unit 254. The P messages 224 are in absolute format.

The P messages 224 from the rearranging circuit 220 are provided to a shifter 226, a cyclic shifter or barrel shifter which shifts the symbol values in the P messages 224 by a shift value 230 to generate the next circulant sub-matrix, yielding current layer P messages 232 which contain the total soft likelihood values of the current layer. The shift value 230 represents the difference in the cyclic shifts between the previous layer and the current layer. The current layer P messages 232 are in absolute format. The shifter 226 can comprise any suitable circuitry for barrel shifting message vectors. Based upon the disclosure provided herein, one of ordinary skill in the art will recognize a variety of circuits that may be included in shifter 226. The bitwise function of the shifter 226 for a GF(4) decoder is 4*b*p, where b is the bitwise grouping of each likelihood value and p is the circulant size.

The current layer P messages 232 are provided to a subtractor 244 which subtracts the current layer check node to variable node messages, or old R messages 242 in absolute format, from the current layer P messages 232, yielding current layer D messages 246 in absolute format. The old R messages 242 are obtained from a zero padding circuit 240 which converts old R messages 266 from normalized format to absolute format. The current layer check node to variable node messages or old R messages 242 are old values for the current layer, generated during a previous decoding iteration. Generally, the vector message from a check node to a variable node contains the probabilities for each symbol d in the Galois Field that the destination variable node contains that symbol d, based on the prior round variable node to check node messages from neighboring variable nodes other than the destination variable node. The inputs from neighboring variable nodes used in a check node to generate the check node to variable node message for a particular neighboring variable node are referred to as extrinsic inputs and include the prior round variable node to check node messages from all neighboring variable nodes except the particular neighboring variable node for which the check node to variable node message is being prepared, in order to avoid positive feedback. The check node prepares a different check node to variable node message for each neighboring variable node, using the different set of extrinsic inputs for each message based on the destination variable node. Subtracting the current layer check node to variable node messages or old R messages 242 from an earlier iteration removes the intrinsic input, leaving only the extrinsic inputs to generate a check node to variable node message for a variable node. The subtractor 244 can comprise any suitable circuitry for subtracting likelihood values. Based upon the disclosure provided herein, one of ordinary skill in the art will recognize a variety of circuits that can be included in subtractor 244.

D messages 246 are provided to a normalizing circuit 250 which converts the format of the D messages 246 from absolute format to normalized format, yielding new Q messages 252 in normalized format. The new Q messages 252 are output from the second part of the variable node unit 256 and stored in memory 204 for subsequent decoding iterations, overwriting previous channel or calculated values for the current layer, and are also provided to a scaling circuit 260 which scales the new Q messages 252 to yield scaled variable node to check node messages 262.

A check node processor or check node unit 264 generates check node to variable node messages in old R messages 266 and new R messages 270 based on the scaled variable node to check node messages 262. The check node unit 264 can apply any low density parity check decoding algorithm, such as, but not limited to, a min-sum based decoding algorithm. In some embodiments of a min-sum based decoding algorithm, the check node unit 264 calculates the minimum value $min_1(d)$, the second or next minimum value $min_2(d)$ and the index of the minimum value idx(d) for each of the q symbols in the Galois Field, based on sub-messages $Q_{i,jk}(d)$ in the message vectors from each neighboring variable node according to the following logic:

$$\begin{aligned}
&\text{if } min_1(d) > Q_{i,jk}(d), \\
&\quad idx(d) = i; \\
&\quad min_2(d) = min_1(d); \\
&\quad min_1(d) = Q_{i,jk}(d); \\
&\text{else} \\
&\quad idx(d) = idx(d); \\
&\quad min_2(d) = min(min_2(d), Q_{i,jk}(d));
\end{aligned}$$

The check node unit 264 also calculates the signs of the variable node to check node messages 262 and tracks the sign value of each non-zero element of the H matrix and the cumulative sign for the current layer. Given the current layer minimum, next minimum and index values with the sign values, calculated in the previous local decoding iteration (thus old), the check node unit 264 calculates the current layer check node to variable node messages or old R messages 266. Given the previous layer minimum, next minimum and index values with the sign values, calculated in the current local decoding iteration (thus new), the check node unit 264 calculates the previous layer check node to variable node messages or new R messages 270.

Again, the check node unit 264 is not limited to any particular low density parity check algorithm, and can comprise any suitable circuitry for generating check node to variable node messages based on variable node to check node messages. Based upon the disclosure provided herein, one of ordinary skill in the art will recognize a variety of circuits that can be included in check node unit 264.

The variable node unit 254, 256 and the check node unit 264 thus operate together to perform layered decoding of non-binary data. The variable node unit 254, 256 generates variable node to check node messages 262 and calculates perceived values based on check node to variable node messages in old R messages 266 and new R messages 270. The term "perceived value" is used herein to refer to the value of symbols to be decoded, and in some embodiments, is represented by likelihood values. The check node unit 264 generates check node to variable node messages and calculates checksums based on variable node to check node messages 262.

A normalizing circuit 234 in the second part of the variable node unit 256 also processes the current layer P messages 232 from shifter 226, converting the format of the current layer P messages 232 from absolute format to normalized format. The normalizing circuit 234 yields P messages at decoder output 236 in normalized format. The P messages at decoder output 236 are also referred to as soft data and decoded values. In some embodiments, the second part of the variable node unit 256 also outputs hard decisions from the output of the normalizing circuit 234, omitting the likelihoods for the Galois Field elements other than the most likely.

Figure 3:
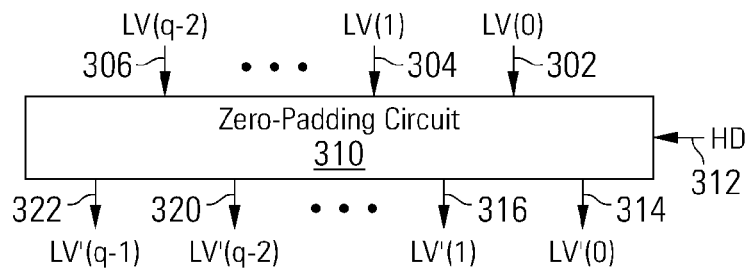
FIG. 3 depicts a zero padding circuit that can be used in a non-binary layered low density parity check decoder with normalized input and output in accordance with one or more embodiments of the present invention.

Turning to FIG. 3, a zero padding circuit 310 that can be used in a non-binary layered low density parity check decoder with normalized input and output is shown in accordance with one or more embodiments of the present invention. Again, the conversion from normalized to absolute likelihood values is referred to herein as zero-padding. The zero padding circuit 310 receives as inputs the normalized likelihood values for each symbol to be converted, including the hard decision 312 or most likely value from the Galois Field, and the likelihoods LV(0) 302, LV(1) 304, and so on to LV(q−2) 306 for each remaining element of the Galois Field. The zero padding circuit 310 outputs the likelihoods LV'(0) 314, LV'(1) 316, and so on to LV'(q−2) 320 and LV'(q−1) 322. Included in likelihoods 314-322 are the likelihood of the most likely Galois Field element for the hard decision 312, and the likelihoods of the remaining Galois Field elements, with the likelihood of the most likely added back to each to reverse the normalization.

Figure 4:
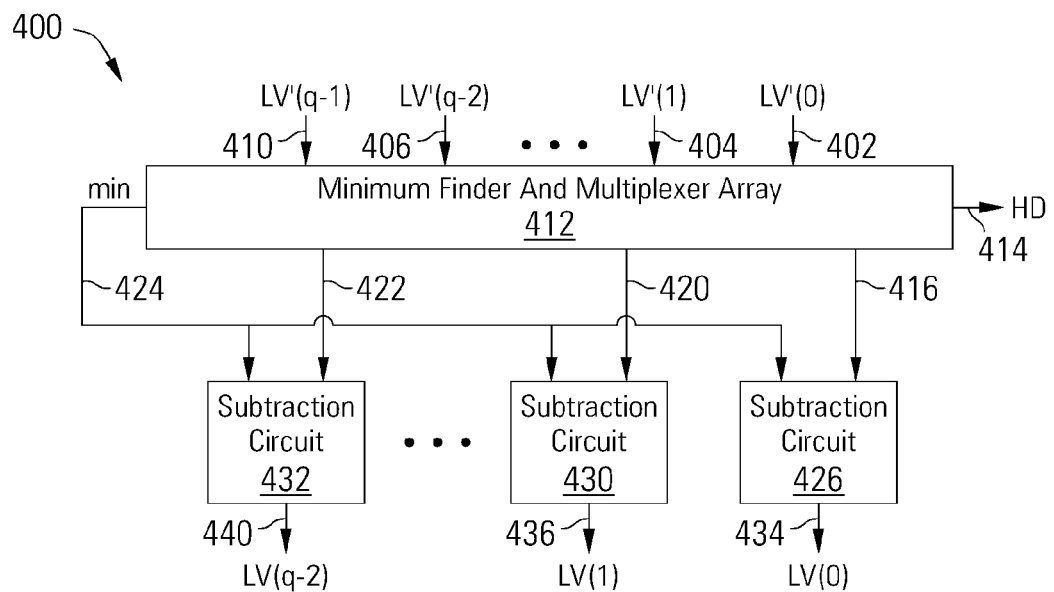
FIG. 4 depicts a normalizing circuit that can be used in a non-binary layered low density parity check decoder with normalized input and output in accordance with one or more embodiments of the present invention.

Turning to FIG. 4, a normalizing circuit 400 is depicted that can be used in a non-binary layered low density parity check decoder with normalized input and output in accordance with one or more embodiments of the present invention. The normalizing circuit 400 converts an input in absolute format to an output in normalized format. The normalizing circuit 400 receives likelihoods LV'(0) 402, LV'(1) 404, and so on to LV'(q−2) 406 and LV'(q−1) 410. A minimum finder and multiplexer array 412 finds the minimum value among the four likelihoods 402-410, and outputs the index of the Galois Field element with the minimum value as the hard decision 414. For example, in a decoder with log likelihood ratios, if LLR'(i) is the minimum value, the hard decision 414 is "i". The likelihood of the hard decision is output as the minimum likelihood 424, and the likelihoods 416, 420, 422 for the remaining Galois Field elements are placed in order according to Table 1 by minimum finder and multiplexer array 412. A subtraction circuit 426 subtracts the minimum likelihood 424 from likelihood 416, yielding likelihood LV(0) 434. A subtraction circuit 430 subtracts the minimum likelihood 424 from likelihood 420, yielding likelihood LV(1) 436. A subtraction circuit 432 subtracts the minimum likelihood 424 from likelihood 422, yielding likelihood LV(q−2) 440. Additional subtraction circuits are included as needed based upon the number of elements in the Galois Field.

Figure 5:
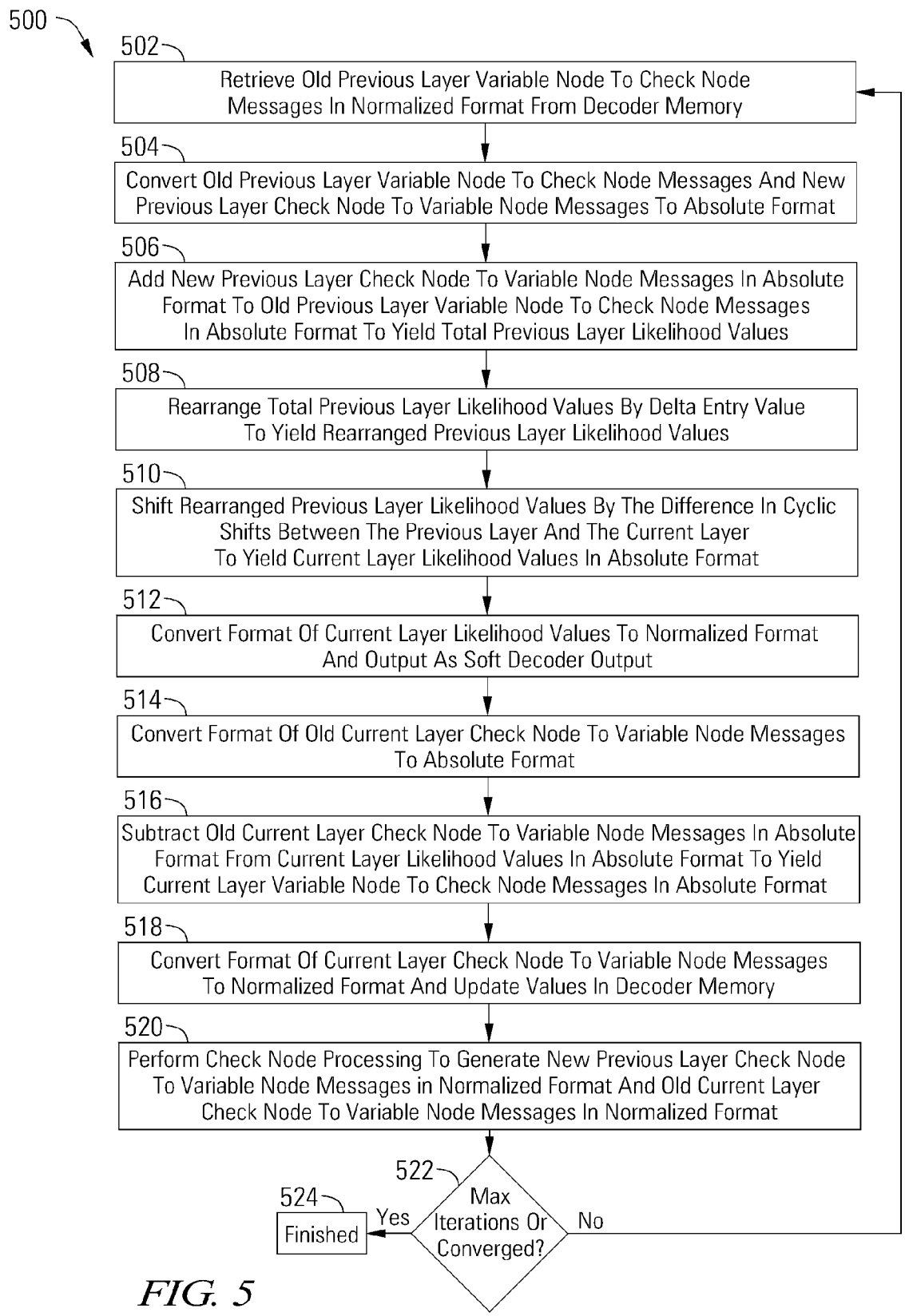
FIG. 5 depicts a flow diagram of an operation for non-binary layered low density parity check decoding with normalized input and output in accordance with one or more embodiments of the present invention.

Turning to FIG. 5, a flow diagram 500 depicts a method for non-binary layered low density parity check decoding with normalized input and output in accordance with one or more embodiments of the present invention. Following flow diagram 500, the old previous layer variable node to check node messages in normalized format are retrieved from a decoder memory. (Block 502) The old previous layer variable node to check node messages are also referred to herein as old Q messages. The old previous layer variable node to check node messages and new previous layer check node to variable node messages are converted to absolute format. (Block 504) The new previous layer check node to variable node messages are also referred to herein as new R messages. The new previous layer check node to variable node messages in absolute format are added to old previous layer variable node to check node messages in absolute format to yield total previous layer likelihood values. (Block 506) The total previous layer likelihood values are rearranged by a delta entry value to yield rearranged previous layer likelihood values. (Block 508) This rearranges the total previous layer likelihood values to prepare for the check node update and to apply the permutations specified by the non-zero H matrix entry values. The total previous layer likelihood values are also referred to herein as S messages. In some embodiments, the delta entry value is $(H_{(i)}/H_{(i-1)})$, the current layer H matrix entry value $H_{(i)}$ divided by the previous layer H matrix entry value $H_{(i-1)}$ with a division operation in GF(q). The rearranged previous layer likelihood values are shifted by the difference in cyclic shifts between the previous layer and the current layer to yield current layer likelihood value in absolute format. (Block 510) The current layer likelihood values are converted to normalized format and output as soft decoder output. (Block 512) The old current layer check node to variable node messages are converted to absolute format. (Block 514) The old current layer check node to variable node messages are also referred to herein as old R messages. The old current layer check node to variable node messages in absolute format are subtracted from current layer likelihood values in absolute format to yield current layer variable node to check node messages in absolute format. (Block 516) The current layer variable node to check node messages are also referred to herein as D messages. The current layer variable node to check node messages are converted to normalized format and the values are updated in the decoder memory. (Block 518) Check node processing is performed to generate new previous layer check node to variable node messages in normalized format and old current layer check node to variable node messages in normalized format, completing the processing of a layer for a decoding iteration. (Block 520) A determination is made as to whether the maximum number of iterations has been reached in the decoder or whether the decoder has converged. (Block 522) If so, decoding is finished. (Block 524) If not, decoding continues at block 502.

Figure 6:
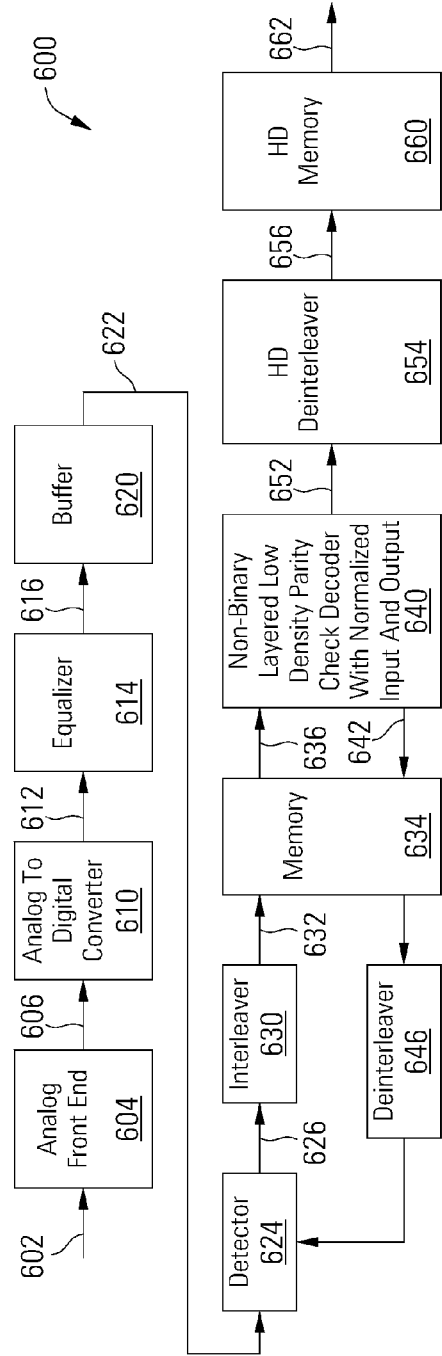
FIG. 6 depicts a block diagram of a read channel with a non-binary layered low density parity check decoding with normalized input and output in accordance with one or more embodiments of the present invention.

Although the non-binary layered low density parity check decoder with normalized input and output disclosed herein is not limited to any particular application, several examples of applications are presented herein that benefit from embodiments of the present invention. Turning to FIG. 6, a read channel 600 with a non-binary layered low density parity check decoding with normalized input and output 640 is depicted in accordance with one or more embodiments of the present invention. The read channel 600 is used to process an analog signal 602 and to retrieve user data bits from the analog signal 602 without errors. In some cases, analog signal 602 is derived from a read/write head assembly in a magnetic storage medium. In other cases, analog signal 602 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 602 can be derived.

The read channel 600 includes an analog front end 604 that receives and processes the analog signal 602. Analog front end 604 may include, but is not limited to, an analog filter and an amplifier circuit as are known in the art. Based upon the disclosure provided herein, one of ordinary skill in the art will recognize a variety of circuitry that may be included as part of analog front end 604. In some cases, the gain of a variable gain amplifier included as part of analog front end 604 may be modifiable, and the cutoff frequency and boost of an analog filter included in analog front end 604 may be modifiable. Analog front end 604 receives and processes the analog signal 602, and provides a processed analog signal 606 to an analog to digital converter 610.

Analog to digital converter 610 converts processed analog signal 606 into a corresponding series of digital samples 612. Analog to digital converter 610 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. In other embodiments, digital data is retrieved directly from a storage device or other source, such as a flash memory. Digital samples 612 are provided to an equalizer 614. Equalizer 614 applies an equalization algorithm to digital samples 612 to yield an equalized output 616. In some embodiments of the present invention, equalizer 614 is a digital finite impulse response filter circuit as is known in the art. Data or codewords contained in equalized output 616 may be stored in a buffer 620 until a data detector 624 is available for processing and ready to receive stored equalized samples 622.

The data detector 624 performs a data detection process on the received input, resulting in a detected output 626. In some embodiments of the present invention, data detector 624 is a Viterbi algorithm data detector circuit, or more particularly in some cases, a maximum a posteriori (MAP) data detector circuit as is known in the art. In these embodiments, the detected output 626 contains log likelihood ratio information about the likelihood that each bit or symbol has a particular value. Based upon the disclosure provided herein, one of ordinary skill in the art will recognize a variety of data detectors that may be used in relation to different embodiments of the present invention. Data detector 624 is started based upon availability of a data set in buffer 620 from equalizer 614 or another source.

The detected output 626 from data detector 624 is provided to an interleaver 630 that protects data against burst errors. Burst errors overwrite localized groups or bunches of bits. Because low density parity check decoders are best suited to correcting errors that are more uniformly distributed, burst errors can overwhelm low density parity check decoders. The interleaver 630 prevents this by interleaving or shuffling the detected output 626 from data detector 624 to yield an interleaved output 632 which is stored in a memory 634. The interleaved output 636 from the memory 634 is provided to a non-binary layered low density parity check decoding with normalized input and output 640 which performs parity checks on the interleaved output 636, ensuring that parity constraints established by a low density parity check encoder (not shown) before storage or transmission are satisfied in order to detect and correct any errors that may have occurred in the data during storage or transmission.

Multiple detection and decoding iterations may be performed in the read channel 600, referred to herein as global iterations. (In contrast, local iterations are decoding iterations performed within the non-binary layered low density parity check decoding with normalized input and output 640.) To perform a global iteration, likelihood values 642 from the non-binary layered low density parity check decoding with normalized input and output 640 are stored in memory 634, deinterleaved in a deinterleaver 646 to reverse the process applied by interleaver 630, and provided again to the data detector 624 to allow the data detector 624 to repeat the data detection process, aided by the log likelihood ratio values 642 from the non-binary layered low density parity check decoding with normalized input and output 640. In this manner, the read channel 600 can perform multiple global iterations, allowing the data detector 624 and non-binary layered low density parity check decoding with normalized input and output 640 to converge on the correct data values.

The non-binary layered low density parity check decoding with normalized input and output 640 also produces hard decisions 652 about the values of the data bits or symbols contained in the interleaved output 632 of the interleaver 630. In a GF(4) low density parity check decoder, the hard decisions can be represented by four field elements with indexes 00, 01, 10 and 11.

The hard decisions 652 from non-binary layered low density parity check decoding with normalized input and output 640 are deinterleaved in a hard decision deinterleaver 654, reversing the process applied in interleaver 630, and stored in a hard decision memory 660 before being provided to a user or further processed. For example, the output 662 of the read channel 600 can be further processed to reverse formatting changes applied before storing data in a magnetic storage medium or transmitting the data across a transmission channel.

Figure 7:
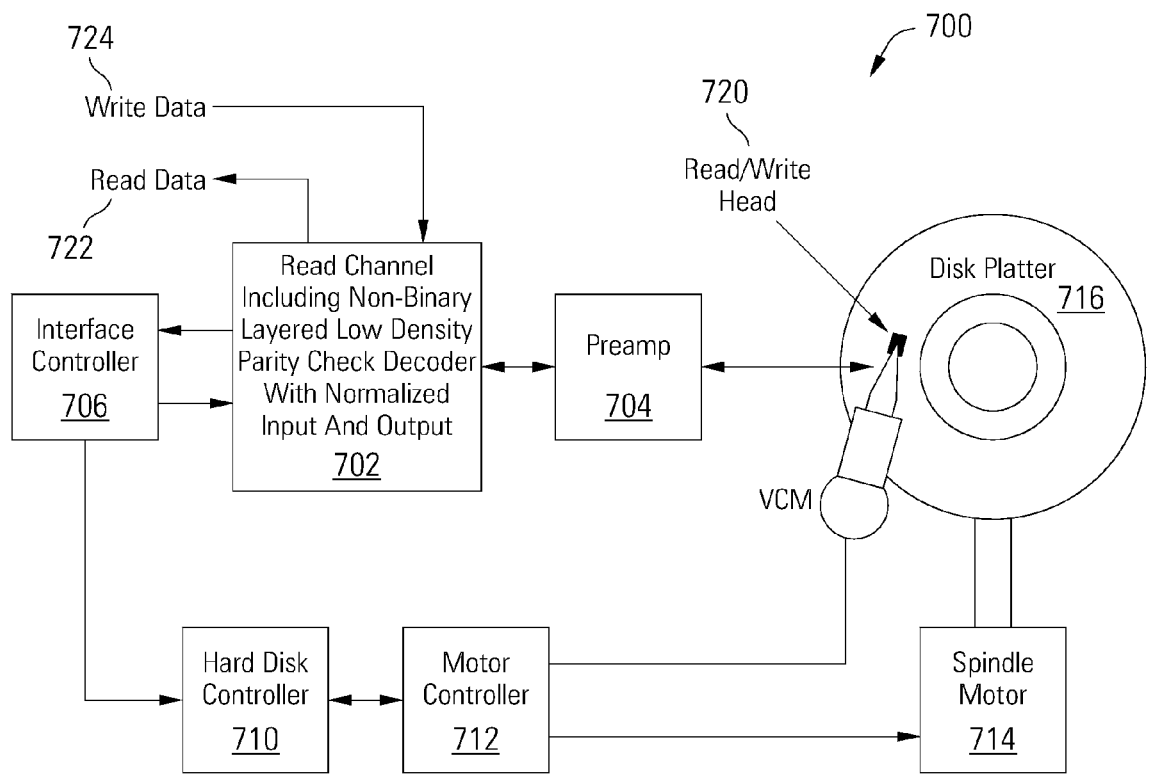
FIG. 7 depicts a storage system including a non-binary layered low density parity check decoder with normalized input and output in accordance with one or more embodiments of the present invention.

Turning to FIG. 7, a storage system 700 is illustrated as an example application of a non-binary layered low density parity check decoder with normalized input and output in accordance with some embodiments of the present invention. The storage system 700 includes a read channel circuit 702 with a non-binary layered low density parity check decoder with normalized input and output in accordance with one or more embodiments of the present invention. Storage system 700 may be, for example, a hard disk drive. Storage system 700 also includes a preamplifier 704, an interface controller 706, a hard disk controller 710, a motor controller 712, a spindle motor 714, a disk platter 716, and a read/write head assembly 720. Interface controller 706 controls addressing and timing of data to/from disk platter 716. The data on disk platter 716 consists of groups of magnetic signals that may be detected by read/write head assembly 720 when the assembly is properly positioned over disk platter 716. In one embodiment, disk platter 716 includes magnetic signals recorded in accordance with either a longitudinal or a perpendicular recording scheme.

In a typical read operation, read/write head assembly 720 is accurately positioned by motor controller 712 over a desired data track on disk platter 716. Motor controller 712 both positions read/write head assembly 720 in relation to disk platter 716 and drives spindle motor 714 by moving read/write head assembly 720 to the proper data track on disk platter 716 under the direction of hard disk controller 710. Spindle motor 714 spins disk platter 716 at a determined spin rate (RPMs). Once read/write head assembly 720 is positioned adjacent the proper data track, magnetic signals representing data on disk platter 716 are sensed by read/write head assembly 720 as disk platter 716 is rotated by spindle motor 714. The sensed magnetic signals are provided as a continuous, minute analog signal representative of the magnetic data on disk platter 716. This minute analog signal is transferred from read/write head assembly 720 to read channel circuit 702 via preamplifier 704. Preamplifier 704 is operable to amplify the minute analog signals accessed from disk platter 716. In turn, read channel circuit 702 digitizes and decodes the received analog signal to recreate the information originally written to disk platter 716. This data is provided as read data 722 to a receiving circuit. While processing the read data, read channel circuit 702 processes the received signal using a non-binary layered low density parity check decoder with normalized input and output. Such a non-binary layered low density parity check decoder with normalized input and output can be implemented consistent with the circuits disclosed above in relation to FIGS. 2-4. In some embodiments, the decoding can be performed consistent with a process disclosed above in relation to FIG. 5. A write operation is substantially the opposite of the preceding read operation with write data 724 being provided to read channel circuit 702. This data is then encoded and written to disk platter 716.

It should be noted that storage system 700 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 700, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 700 may be modified to include solid state memory that is used to store data in addition to the storage offered by disk platter 716. This solid state memory may be used in parallel to disk platter 716 to provide additional storage. In such a case, the solid state memory receives and provides information directly to read channel circuit 702. Alternatively, the solid state memory may be used as a cache where it offers faster access time than that offered by disk platter 716. In such a case, the solid state memory may be disposed between interface controller 706 and read channel circuit 702 where it operates as a pass through to disk platter 716 when requested data is not available in the solid state memory or when the solid state memory does not have sufficient storage to hold a newly written data set. Based upon the disclosure provided herein, one of ordinary skill in the art will recognize a variety of storage systems including both disk platter 716 and a solid state memory.

Figure 8:
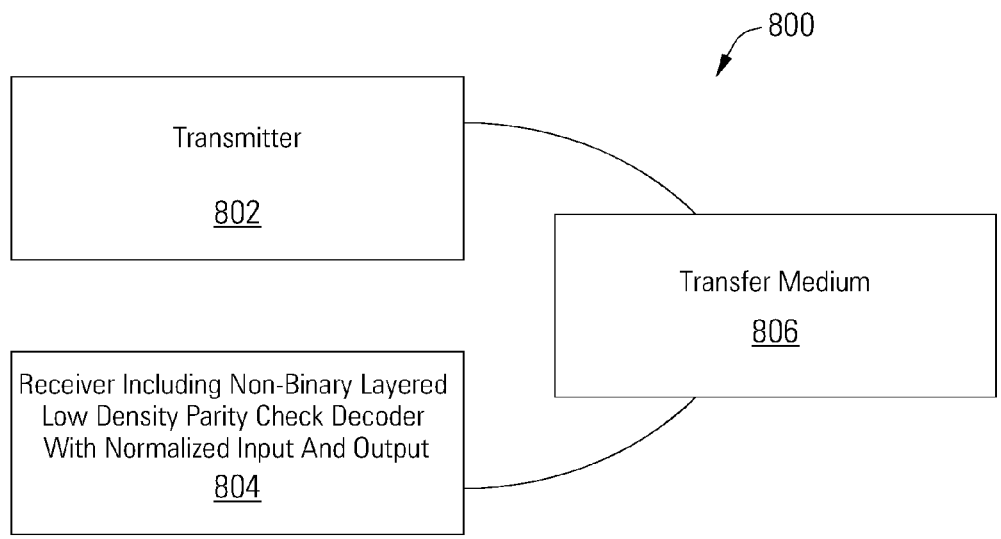
FIG. 8 depicts a wireless communication system including a non-binary layered low density parity check decoder with normalized input and output in accordance with one or more embodiments of the present invention.

Turning to FIG. 8, a wireless communication system 800 or data transmission device including a receiver 804 with a non-binary layered low density parity check decoder with normalized input and output is shown in accordance with some embodiments of the present invention. The transmitter 802 is operable to transmit encoded information via a transfer medium 806 as is known in the art. The encoded data is received from transfer medium 806 by receiver 804. Receiver 804 incorporates a non-binary layered low density parity check decoder with normalized input and output. The decoding can be performed using a circuit similar to that discussed above in relation to FIGS. 2-4, and/or can be performed consistent with a process discussed above in relation to FIG. 5.

Figure 9:
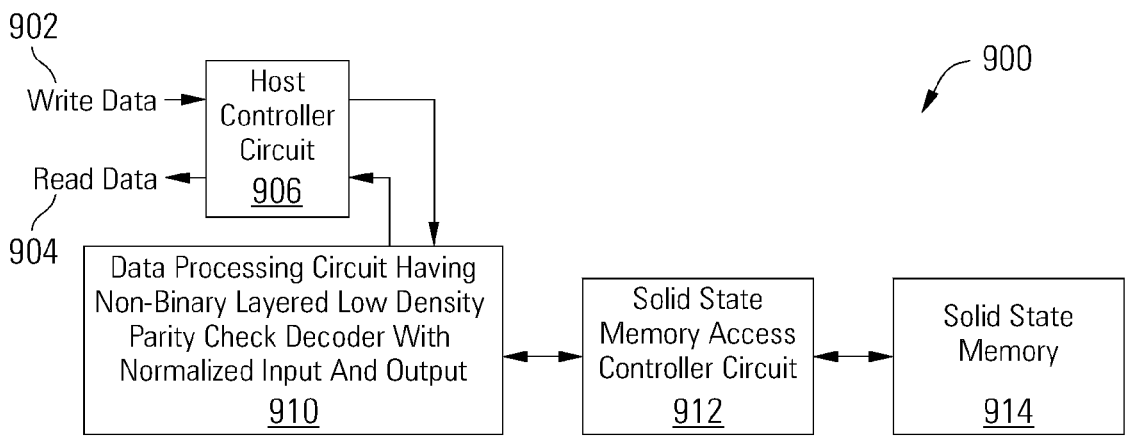
FIG. 9 depicts another storage system including a data processing circuit having a non-binary layered low density parity check decoder with normalized input and output in accordance with one or more embodiments of the present invention.

Turning to FIG. 9, another storage system 900 is shown that includes a data processing circuit 910 having a non-binary layered low density parity check decoder with normalized input and output in accordance with one or more embodiments of the present invention. A host controller circuit 906 receives data to be stored (i.e., write data 902). This data is provided to data processing circuit 910 where it is encoded using a low density parity check encoder. The encoded data is provided to a solid state memory access controller circuit 912. Solid state memory access controller circuit 912 can be any circuit known in the art that is capable of controlling access to and from a solid state memory. Solid state memory access controller circuit 912 formats the received encoded data for transfer to a solid state memory 914. Solid state memory 914 can be any solid state memory known in the art. In some embodiments of the present invention, solid state memory 914 is a flash memory. Later, when the previously written data is to be accessed from solid state memory 914, solid state memory access controller circuit 912 requests the data from solid state memory 914 and provides the requested data to data processing circuit 910. In turn, data processing circuit 910 decodes the received data using a non-binary layered low density parity check decoder with normalized input and output. The decoding can be performed using a circuit similar to that discussed above in relation to FIGS. 2-4, and/or can be performed consistent with a process discussed above in relation to FIG. 5. The decoded data is provided to host controller circuit 906 where it is passed on as read data 904.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for non-binary layered low density parity check decoding with normalized input and output. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. A low density parity check decoder comprising:
   a variable node processor operable to generate variable node to check node messages and to calculate perceived values based on normalized check node to variable node messages and on normalized decoder inputs, and to output normalized decoded values; and
   a check node processor operable to generate the check node to variable node messages based on normalized variable node to check node messages, wherein the variable node processor and check node processor are operable to perform layered multi-level decoding.

2. The decoder of claim 1, wherein the normalized decoder inputs and normalized decoded values comprise hard decisions and soft data, wherein the soft data is normalized to a likelihood of the corresponding hard decision.

3. The decoder of claim 1, wherein the variable node processor comprises a format conversion circuit operable to convert the normalized decoder inputs to a non-normalized format.

4. The decoder of claim 3, wherein the non-normalized format of a likelihood value for a symbol comprises probabilities for each element of a Galois Field that the symbol has a value of the corresponding element.

5. The decoder of claim 1, wherein the variable node processor comprises a format conversion circuit operable to convert the check node to variable node messages for a previous layer to a non-normalized format.

6. The decoder of claim 1, wherein the variable node processor comprises a first part and a second part, the decoder further comprising a shifter between the variable node processor first part and the variable node processor second part, the shifter operable to apply a cyclic shift based on a difference in cyclic shifts between a previous layer and a current layer to yield total likelihood values for a current layer.

7. The decoder of claim 1, wherein the variable node processor comprises an adder operable to add the check node to variable node messages for a previous layer to the variable node to check node messages for the previous layer calculated in an earlier decoding iteration to yield total likelihood values for the previous layer, wherein the inputs and output of the adder are in a non-normalized format.

8. The decoder of claim 1, wherein the variable node processor comprises a rearranging circuit operable to rearrange total likelihood values for a previous layer by a delta entry value to yield rearranged likelihood values for the previous layer, wherein the delta entry value comprises a current layer H matrix entry value divided by a previous layer H matrix entry value.

9. The decoder of claim 1, wherein the variable node processor comprises a format conversion circuit operable to convert the check node to variable node messages calculated in an earlier decoding iteration for a current layer to a non-normalized format.

10. The decoder of claim 1, wherein the variable node processor comprises a subtractor operable to subtract non-normalized check node to variable node messages calculated in an earlier decoding iteration for a current layer from non-normalized total likelihood values for the current layer to yield non-normalized variable node to check node messages for the current layer.

11. The decoder of claim 1, wherein the variable node processor comprises a normalizing circuit operable to convert non-normalized total likelihood values for the current layer to normalized total likelihood values for the current layer as the normalized decoded values.

12. The decoder of claim 1, wherein the variable node processor comprises a normalizing circuit operable to convert non-normalized variable node to check node messages for a current layer to the normalized variable node to check node messages for the current layer.

13. The decoder of claim 1, wherein the check node processor is operable to apply a min-sum based algorithm.

14. The decoder of claim 1, wherein the decoder is implemented as an integrated circuit.

15. The decoder of claim 1, wherein the decoder is incorporated in a storage device.

16. The decoder of claim 1, wherein the decoder is incorporated in a transmission system.

17. A method of decoding data in a non-binary layered low density parity check decoder, comprising:
    converting a format of a variable node to check node message for a previous layer from a normalized format to a non-normalized format, wherein the data to be decoded is represented by the variable node to check node message;
    converting a format of a check node to variable node message for the previous layer from the normalized format to the non-normalized format;
    generating a variable node to check node message for a current layer based at least in part on the variable node to check node message for the previous layer, the check node to variable node message for the previous layer, and a delta H matrix value, wherein the variable node to check node message for the current layer is in the normalized format; and
    outputting decoded data in the normalized format based on the variable node to check node message from the non-binary layered low density parity check decoder.

18. The method of claim 17, wherein the delta H matrix value comprises a current layer H matrix entry value divided by a previous layer H matrix entry value in a Galois Field division operation.

19. The method of claim 17, wherein the normalized format comprises a hard decisions and soft data, wherein the soft data is normalized to a likelihood of the corresponding hard decision, and wherein the non-normalized format of a likelihood value for a symbol comprises probabilities for each element of a Galois Field that the symbol has a value of the corresponding element.

20. A storage system comprising:
    a storage medium;
    a head assembly disposed in relation to the storage medium and operable to provide a sensed signal corresponding to information on the storage medium;
    an analog to digital converter circuit operable to sample an analog signal derived from the sensed signal to yield a series of digital samples; and
    a non-binary layered low density parity check decoder operable to decode data in a signal derived from an output of the analog to digital converter circuit, wherein an input and an output of the non-binary layered low density parity check decoder are in a normalized format comprising hard decisions and soft data, wherein the soft data is normalized to a likelihood of the corresponding hard decision.

* * * * *